(«12») United States Patent
Kuttner

(10) Patent No.: US 10,601,437 B1
(45) Date of Patent: Mar. 24, 2020

(54) CDAC (CAPACITIVE DAC (DIGITAL-TO-ANALOG CONVERTER)) UNIT CELL FOR MULTIPHASE RFDAC (RADIO FREQUENCY DAC)

(71) Applicant: Intel Corporation, Santa Clara, CA (US)

(72) Inventor: Franz Kuttner, St. Ulrich (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/233,450

(22) Filed: Dec. 27, 2018

(51) Int. Cl.
| | |
|---|---|
| *H03M 1/66* | (2006.01) |
| *H03M 1/80* | (2006.01) |
| *H04B 1/04* | (2006.01) |
| *H03M 1/86* | (2006.01) |
| *H04B 1/44* | (2006.01) |

(52) U.S. Cl.
CPC ........... *H03M 1/804* (2013.01); *H03M 1/661* (2013.01); *H03M 1/86* (2013.01); *H04B 1/04* (2013.01); *H04B 1/44* (2013.01); *H04B 2001/0491* (2013.01)

(58) Field of Classification Search
CPC .......... H03M 1/74; H03M 1/66; H03M 1/662; H03M 1/0863; H03M 1/742; H03M 1/747; H03M 3/464; H03M 3/496; H03M 1/0673; H03M 1/0845; H03M 1/361; H03M 1/68; H03M 3/50
USPC .................................................. 341/144, 150
See application file for complete search history.

(56) References Cited

U.S. PATENT DOCUMENTS

| | | | | |
|---|---|---|---|---|
| 9,484,943 | B2* | 11/2016 | Op 'T Eynde | H03M 1/0612 |
| 9,800,452 | B2* | 10/2017 | Lehtinen | H03D 7/1441 |
| 9,900,017 | B1* | 2/2018 | Clark | H03M 1/0626 |
| 9,900,022 | B2* | 2/2018 | Ghosh | H03H 7/0115 |
| 2014/0049318 | A1* | 2/2014 | Goswami | H03F 1/0277 |
| | | | | 330/253 |
| 2014/0269976 | A1* | 9/2014 | Klepser | H04B 7/0413 |
| | | | | 375/295 |
| 2016/0094235 | A1* | 3/2016 | Kuttner | H03M 1/662 |
| 2016/0173269 | A1* | 6/2016 | Kuttner | H04L 7/0083 |
| | | | | 375/347 |

(Continued)

OTHER PUBLICATIONS

International Search Report and Written Opinion dated Dec. 27, 2018 for PCT Application PCT/EP2019/057574.

(Continued)

*Primary Examiner* — Linh V Nguyen
(74) *Attorney, Agent, or Firm* — Eschweiler & Potashnik, LLC

(57) ABSTRACT

CDAC (Capacitive DAC (Digital-to-Analog Converter) unit cells and RFDACs (Radio Frequency DACs) employing such CDAC unit cells are disclosed that can be employed for mmWave (millimeter wave) communication are disclosed. One example CDAC unit cell comprises: four capacitors connected in pairs to two differential outputs of the CDAC unit cell; and four logic gates, wherein each logic gate of the four logic gates is configured to receive an associated clock signal of four different clock signals and an associated enable signal of four different enable signals, and wherein each logic gate of the four logic gates is configured to trigger an associated pulse from an associated capacitor of the four capacitors based on the associated clock signal and the associated enable signal of that logic gate.

14 Claims, 11 Drawing Sheets

(56) References Cited

U.S. PATENT DOCUMENTS

2016/0285470 A1\* 9/2016 Leuschner .............. H03M 1/66
2017/0077904 A1\* 3/2017 Bhagavatula ........ H03K 17/691
2017/0222859 A1\* 8/2017 Lehtinen .............. H03D 7/1441

OTHER PUBLICATIONS

Buckel, Tobias et al; A Novel Digital-Intensive Hybrid Polar-I/Q RF Transmitter Architecture; IEEE Transactions On Circuits and Systems I: Regular Papers, vol. 65, No. 12; Dec. 1, 2018.

\* cited by examiner 2x amplitude change utilized by updating differential clock components independently

CDAC (CAPACITIVE DAC (DIGITAL-TO-ANALOG CONVERTER)) UNIT CELL FOR MULTIPHASE RFDAC (RADIO FREQUENCY DAC)

FIELD

The present disclosure relates to wireless technology, and more specifically to techniques and systems involving CDAC(s) (Capacitive DAC(s) (Digital-to-Analog Converter(s)) employable as Radio Frequency (RF) Digital-to-Analog Converter(s) (DAC(s)) and/or cell(s) of such CDAC(s) employable as RFDAC(s).

BACKGROUND

Mobile communication has evolved significantly from early voice systems to today's highly sophisticated integrated communication platform. The next generation wireless communication system, 5G (or new radio (NR)) will provide access to information and sharing of data anywhere, anytime by various users and applications. NR is expected to be a unified network/system that target to meet vastly different and sometime conflicting performance dimensions and services. Such diverse multi-dimensional requirements are driven by different services and applications. In general, NR will evolve based on 3GPP (Third Generation Partnership Project) LTE (Long Term Evolution)-Advanced with additional potential new Radio Access Technologies (RATs) to enrich people lives with better, simple and seamless wireless connectivity solutions. NR will enable everything connected by wireless and deliver fast, rich contents and services.

NR will include bandwidths not employed in existing (e.g., current LTE-A (Long Term Evolution-Advanced)) systems, including mmWave frequency bands, which provides a significant increase in available bandwidth, but at higher frequencies than employed in existing systems. Because mmWave communication is at a substantially higher frequency than existing systems, some existing techniques and components are not well adapted to operating at mmWave frequencies. As one example, RFDACs employing polar converters become difficult or impossible to employ at higher frequencies.

DETAILED DESCRIPTION

Figure 1:
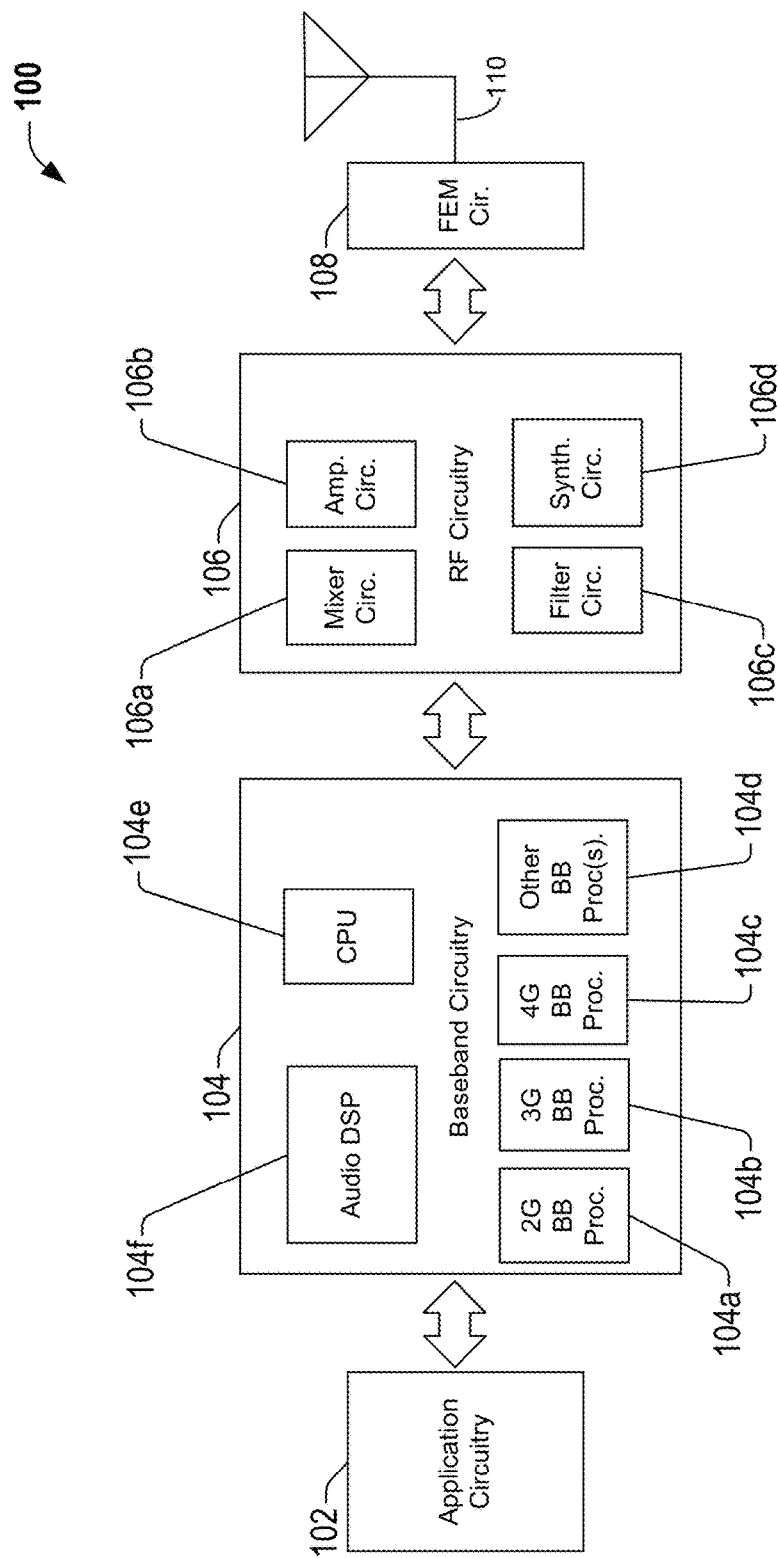
FIG. 1 is a block diagram illustrating an example user equipment (UE) useable in connection with various aspects described herein.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Various embodiments discussed herein comprise a tunable matching network comprising a wideband signal buffer, and systems and techniques that employ a tunable matching network as discussed herein. Tunable matching networks and associated systems and techniques discussed herein can provide small variability for gain attenuation, good linearity, and constant input and output impedance with different gain settings. As such, apparatuses, systems, and methods discussed herein can be employed for 5G (Fifth Generation) NR, including mmWave, in a transceiver of a communication device such as a UE (User Equipment) or base station such as a gNB (next generation Node B) or eNB (Evolved Node B).

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuitry 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, either as multiplication of signals or as a sampling of the signal, amplifier circuitry 106b and filter circuitry 106c. The transmit signal path of the RF circuitry 106 may include filter circuitry 106c and mixer circuitry 106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or band-pass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature down conversion and/or up conversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a of the transmit signal path may be arranged for direct down conversion and/or direct up conversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110).

In some embodiments, the UE device 100 may include additional elements such as, for example, memory/storage, display, camera, sensor, and/or input/output (I/O) interface.

Figure 2:
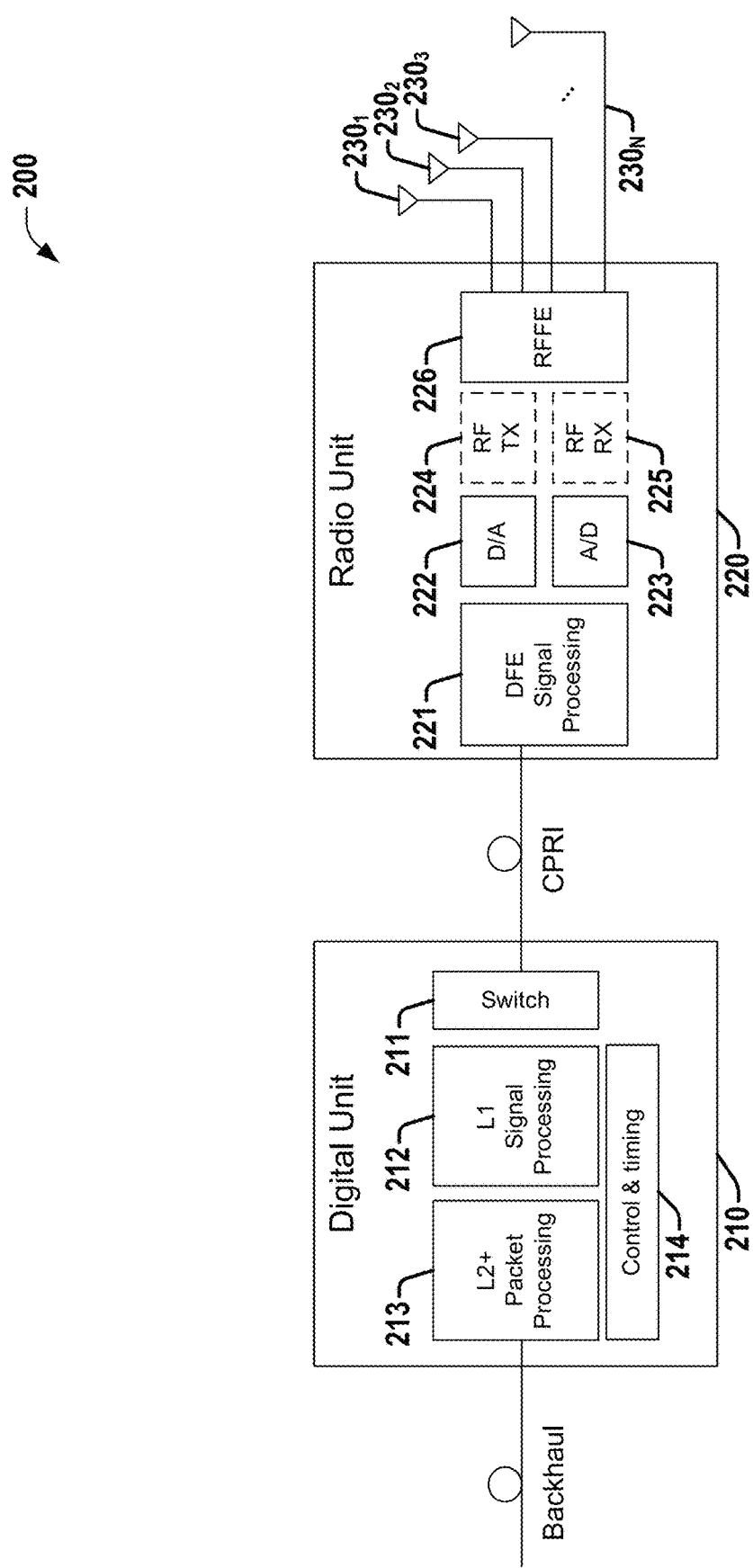
FIG. 2 is a block diagram illustrating example components of a Base Station (BS) device (e.g., eNB, gNB, etc.) that can be employed in connection with various aspects discussed herein.

Referring to FIG. 2, illustrated are example components of a Base Station (BS) device (e.g., eNB, gNB, etc.) 200 that can be employed in connection with various aspects discussed herein. In some embodiments, the BS device 200 can comprise a digital unit 210 and one or more radio units 220, each of which can be connected to one or more antennas $230_i$.

The digital unit 210 can comprise a switch 211, layer 1 (L1) signal processing circuitry 212, layer 2+(L2+) packet processing circuitry 213, and control and timing circuitry 214. The digital unit 210 can perform at least the following functions: (a) Switching (e.g., via switch 211) between various radio units (on cell towers or roof tops), and various baseband cards, in the digital unit; (b) Layer 1 signal processing (e.g., via L1 signal processing circuitry 212), performing the modulation/demodulation and forward error correction functions of actual waveforms to be transmitted on different RF carriers and bands; (c) Layer 2 scheduling of users (e.g., via L2+ packet processing circuitry 213); (d) Layer 2/layer 3 packet processing (e.g., via L2+ packet processing circuitry 213); (e) Control plane processing and timing/synchronization (e.g., via control and timing circuitry 214); and (f) Encryption of packets going into the backhaul (e.g., via control and timing circuitry 214). In various embodiments, the backhaul link to the core network can be one or more of wired (e.g., copper, fiber, etc.) or wireless (for example, via a mesh network comprising one or more additional access points, etc.).

Each radio unit 220 can comprise DFE (Digital Front End) signal processing circuitry 221, one or more digital to analog converters (DACs) 222 associated with transmit chain(s), one or more analog to digital converters (ADCs) 223 associated with receive chain(s), optional RF (Radio Frequency) transmit circuitry 224 associated with transmit chain(s), optional RF (Radio Frequency) receive circuitry 225 associated with receive chain(s), and RF FE (Front End) circuitry 226. The digital unit 210 can perform at least the following functions: (a) Digital front-end (DFE) signal processing (perform digital IF carrier combining, crest factor reduction, digital pre-distortion of Power Amplifiers) (e.g., via DFE signal processing circuitry 221); (b) Digital to Analog and Analog to Digital conversion (e.g., via DACs 222 and ADCs 223); (c) RF mixing (i.e. modulation), and RF frequency synthesizers; (d) RF Front-end functions: power amplifiers (PA), low-noise amplifiers (LNA), Variable gain amplifiers (VGA), filters, switches (TDD) or duplexers (FDD) (e.g., via RF front end circuitry 226). In aspects omitting RF transmit circuitry 224 and/or RF receive circuitry 225, The DACs 222 and/or ADCs 223 can work at RF sampling rates, making analog/RF modulation/demodulation unnecessary.

From radio unit(s) 220, the RF signal can be fed to antennas $230_i$. In current radio base-stations, antennas are external, and there is an industry effort to develop Active antenna systems (AAS) with integrated RF and antenna arrays, for example, for 5G.

Various embodiments discussed herein relate to multiphase CDAC(s) (Capacitive DAC(s)) employable as RFDAC(s) (Radio Frequency DAC(s)) (e.g., as DAC(s) of RF circuitry 106 of system 100 or as DAC(s) of DACs 222 of system 200) and unit cells of such CDAC(s). Additional embodiment include transceiver(s) and/or communication device(s) (e.g., UE(s) (User Equipment(s)), Base Station(s) (e.g., gNB(s), eNB(s), etc.) employing one or more CDAC(s) according to embodiments discussed herein as RFDAC(s) (e.g., employing such CDAC(s) as DAC(s) of RF circuitry 106 of system 100 or as DAC(s) of DACs 222 of system 200).

As discussed above (e.g., in connection with FIGS. 1-2), transceivers and transmitters employ DAC(s). In various transceivers/transmitters, digital RFDAC(s), realized as capacitive DACs, are used. A polar converter can deliver the best efficiency. However, the blocking point for a polar transmitter is the generation of a modulated clock for new standards such as 5G/NR (e.g., for the hundred MHz bandwidth or greater). Thus, a digital I/O architecture can be employed for such bandwidths.

A digital I (In-phase)/Q (Quadrature) transmitter does not require a CORDIC (Coordinate Rotation Digital Computer), is simple, and has a low computing cost with low power consumption. However, at a phase of 45 degrees the output power is reduced by 3 dB.

To reduce this drop in power, a multiphase DAC can be used. In a multiphase DAC, Instead of using quadrature architecture with 4 phases (0°, 90°, 180°, 270°), 8, 12, 16 or even 32 phases can be used. The maximal power drop can be decreased from 3 dB for a conventional IQ Tx (Transmitter) with 4 phases to at least 0.67 dB for a multiphase TX architecture with 8 phases, with further reduction in power drop for multiphase architectures with more phases.

Figure 3:
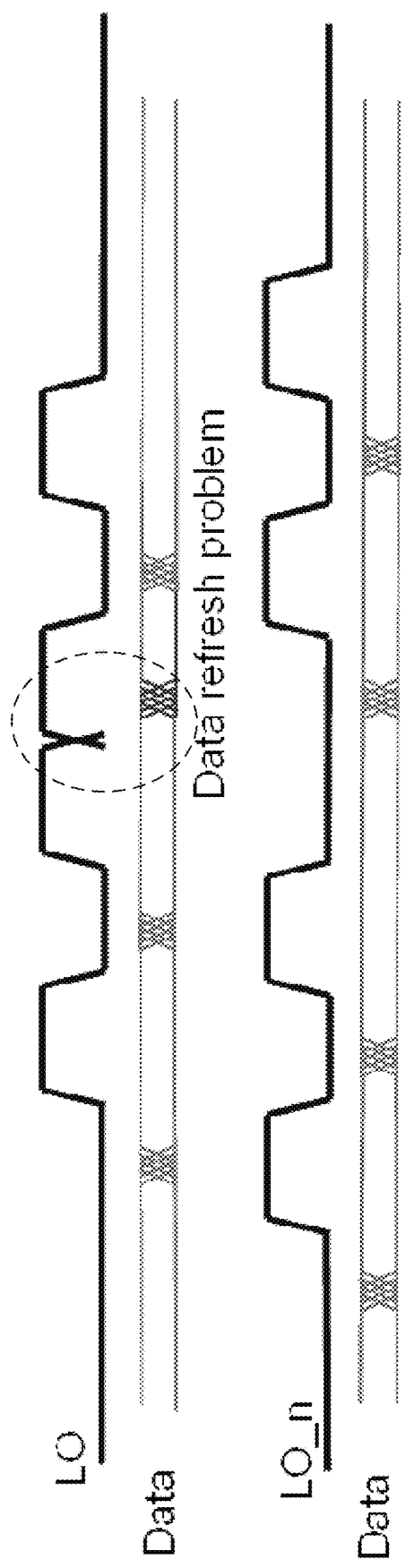
FIG. 3 is a diagram illustrating a data refresh problem from sign change in a four phase CDAC.

For four phase CDACs (classical I/O), the main issue was the sign change (e.g., from positive I to negative I, etc.). At the sign change, two LO pulses can follow each other without any gap. Referring to FIG. 3, illustrated is a diagram of the data refresh problem from sign change in a four phase CDAC. By resorting to the used columns of the capacitor array, the problem of the missing setup time for the digital data can be resolved.

However, multiphase CDACs have additional issues to be addressed compared with four phase CDACs. For multiphase, the problem gets more severe because on some points where the octant (for 8-phase, or corresponding region for 12-phase, 16-phase, 32-phase, etc.) should be changed, an overlapping of the LO pulses appears.

For multiphase DAC, a mirroring technique can be employed, wherein multiple data streams (e.g., the two data streams referred to herein as U and V in the example eight-phase embodiments discussed herein) and clocks can be generated.

Figure 4:
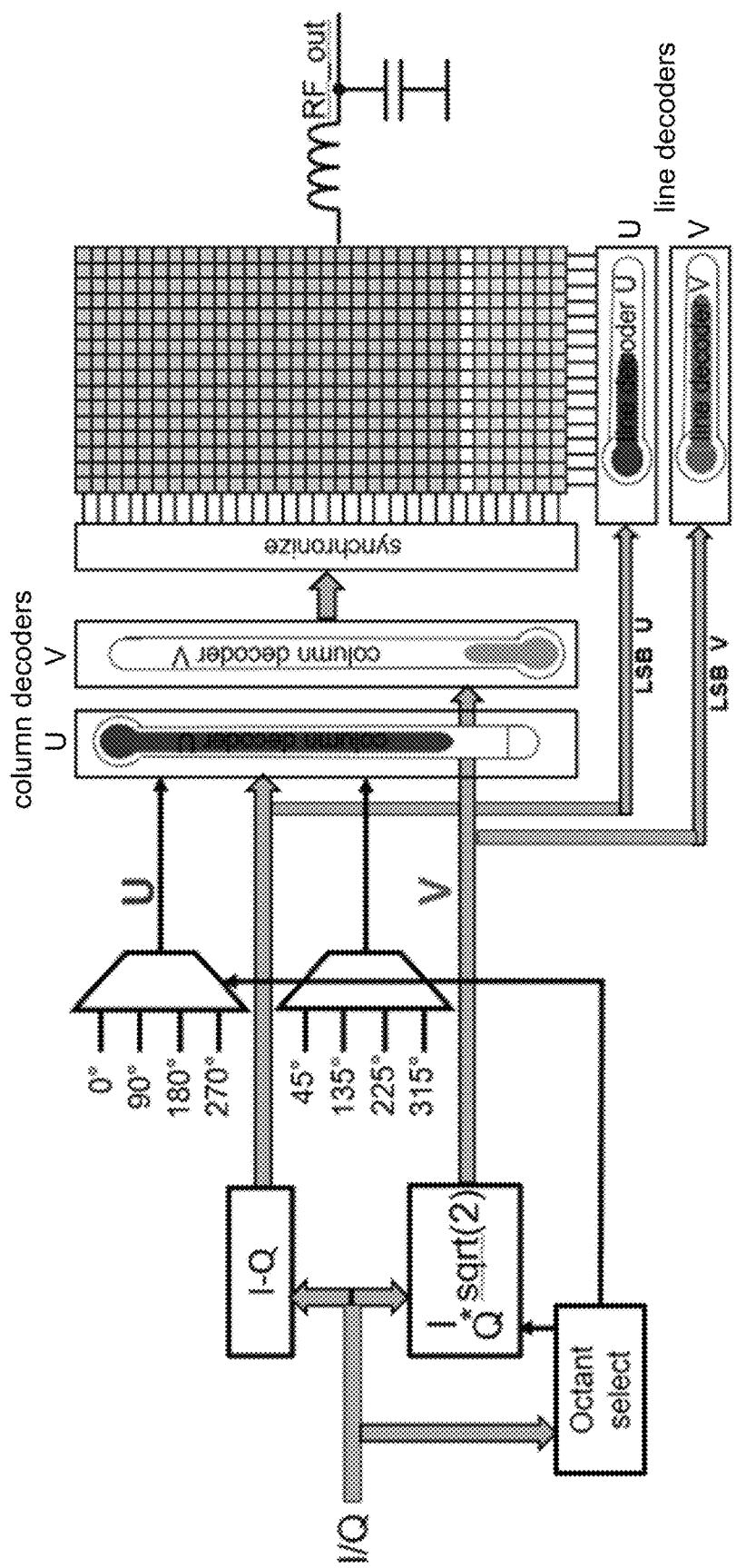
FIG. 4 is a diagram illustrating an example eight-phase DAC that can employ CDAC unit cells according to various aspects discussed herein.
Figure 5:
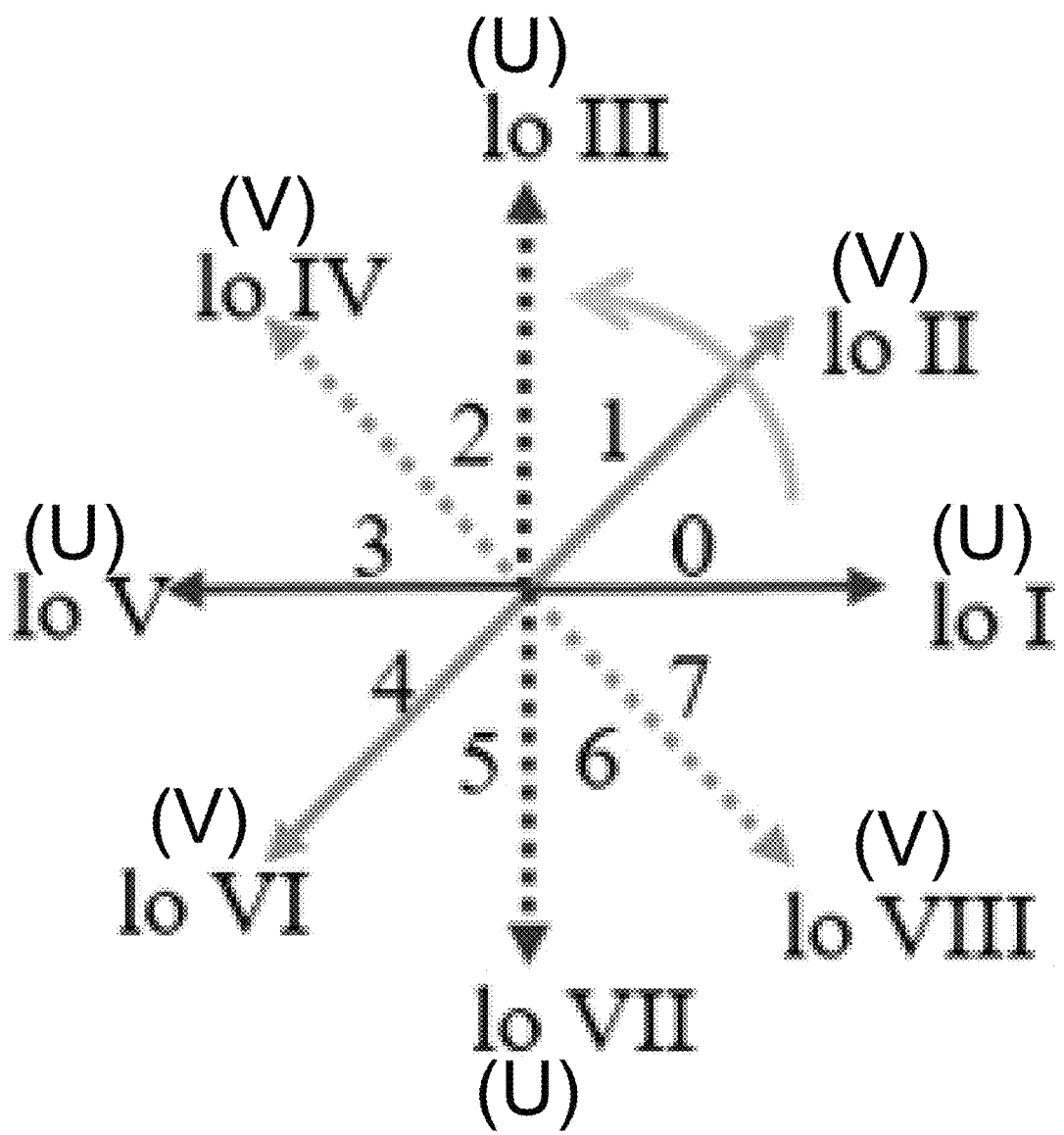
FIG. 5 is a diagram illustrating octants of an eight-phase DAC that can employ existing unit cells or CDAC unit cells according to various aspects discussed herein.

Referring to FIG. 4, illustrated is a diagram of an example eight-phase DAC that can employ existing unit cells or CDAC unit cells according to various aspects discussed herein. Referring to FIG. 5, illustrated is a diagram showing octants of an eight-phase DAC that can employ existing unit cells or CDAC unit cells according to various aspects discussed herein.

To change the phase from octant 0 to octant 1 the phase for the V data is changed by 90 degree instead of changing the phase for U and V by 45 degree (FIGS. 2 & 3). This mirroring simplifies the architecture of the DAC. For U, only the phases 0, 90, 180 and 270 degrees have to be generated, whereas for the V DAC the possible phases are 45, 135, 225 and 315 degrees.

Changing the phase in a direction which decreases the generated frequency is possible without any problem. But changing the phase in the other direction, where the frequency is increased, can create a significant problem for existing DACs.

Although FIGS. 4 and 5 show specific examples for an eight-phase RFDAC (e.g., which can employ CDAC unit cells according to various embodiments discussed herein), various embodiments can comprise multiphase DAC(s) with more than 8 phases (e.g., 12, 16, 32, etc.). For a 4N phase DAC, N data streams can be employed (e.g., $X_1$-$X_N$), wherein each of the 4N phases are equally distributed around the unit circle (e.g., 0°, 360°/4N, 2(360°/4N), etc.), with each data stream having its own associated column decoder and associated line decoder and being associated with four of the 4N phases, which are also equally distributed around the unit circle (e.g., 0°, 90°, 180°, and 270°;

$$\frac{360°}{4N}, \frac{360°}{4N}+90°, \frac{360°}{4N}+180°, \text{ and } \frac{360°}{4N}+270°;$$

etc.). In general, for N data streams $X_1$-$X_N$, there are 4N (e.g., 8, 12, etc.) phases, and data stream $X_i$ is associated with phases $$(i-1)\frac{360°}{4N}, (i-1)\frac{360°}{4N}+90°, (i-1)\frac{360°}{4N}+180°, \text{ and } (i-1)\frac{360°}{4N}+270°.$$

Figure 6:
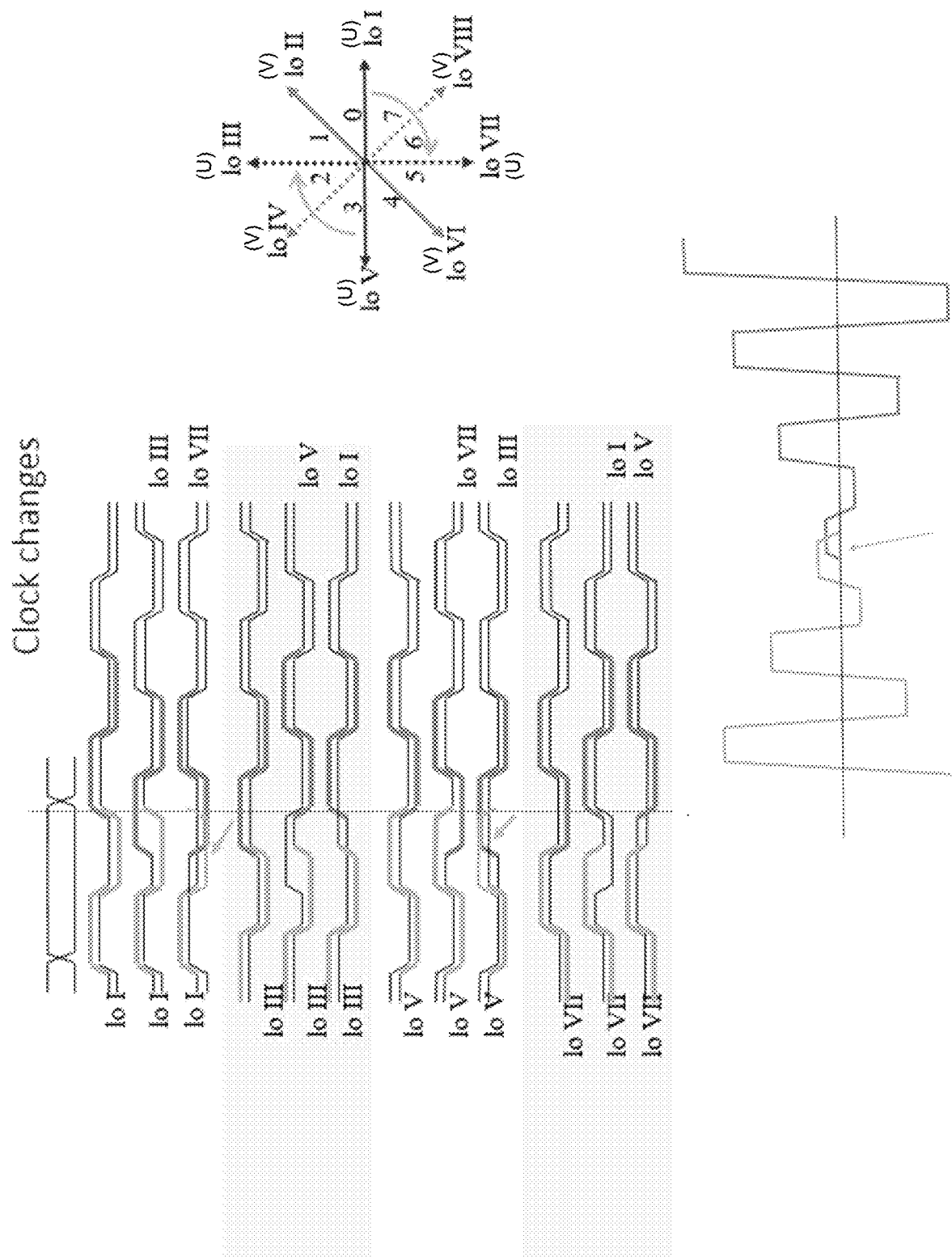
FIG. 6 is a diagram illustrating all possible phase changes of a first data stream, U (associated with the phases 0, 90, 180 and 270 degrees) for a multiphase DAC.
Figure 7:
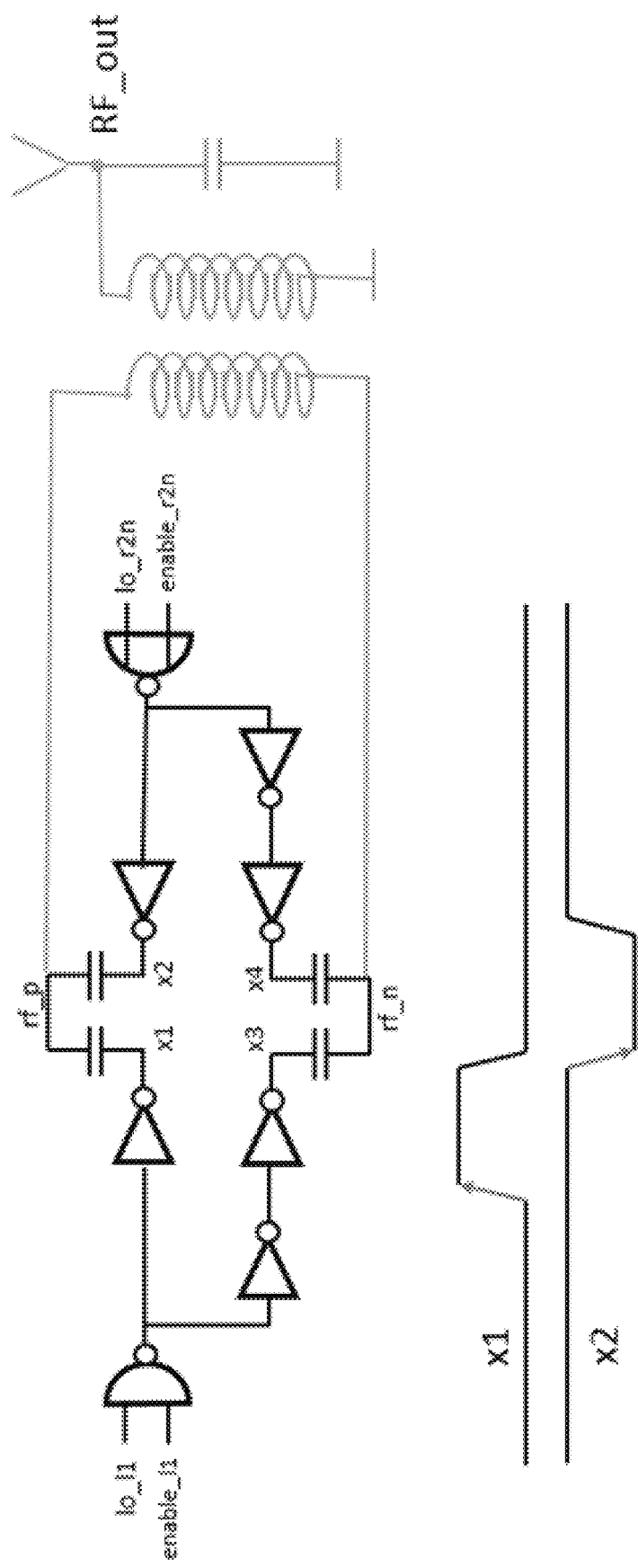
FIG. 7 is a diagram illustrating an example four capacitor cell of a CDAC based on existing techniques, along with example signals

Referring to FIG. 6, illustrated is a timing diagram for all possible phase changes of a first data stream, U (associated with the phases 0, 90, 180 and 270 degrees) for a multiphase DAC. Due to the mirroring principle, the same diagram (with corresponding changes of clocks/LOs (local oscillators)) applies to the second data stream, V (associated with the phases 45, 135, 225 and 315 degrees). Referring to FIG. 7, illustrated is a diagram of an example 4 capacitor cell of a CDAC based on existing techniques, along with example signals x1 and x2. In the example cell of FIG. 7 (employing DIN symbols for logic gates), signals x3 and x4 are generated based on the outputs of the same gates as signals x1 and x2, respectively, but include an additional inverter (NOT gate), such that double ended output can be provided by signals x1 and x3, and signals x2 and x4.

The timing diagram of FIG. 6 shows example transitions from one phase (light gray, on the left) to another phase (darker gray, on the right). The 4 capacitor cell of FIG. 7 provides for smaller LO leakage. Thus, two pulses are always generated. The lower portion of FIG. 7 shows both signals x1 and x2 for transitions between the octants. As can be seen in FIG. 6, there are two transitions that cannot be done with the example cell of FIG. 7 (as indicated by the arrows and dotted lines in the timing diagrams of FIG. 6). The transition from LO I to LO VII and the transition from LO V to LO III generate overlapping pulses. However, it is not possible to generate two overlapping pulses with one capacitor.

In various aspects, embodiments discussed herein can employ a CDAC unit cell that employs the differential structure of the cell to generate pulses.

In such embodiments, pulses can be generated single-ended, but with double the amplitude. To accomplish this, the capacitors of the differential structure can be driven independently.

Figure 8:
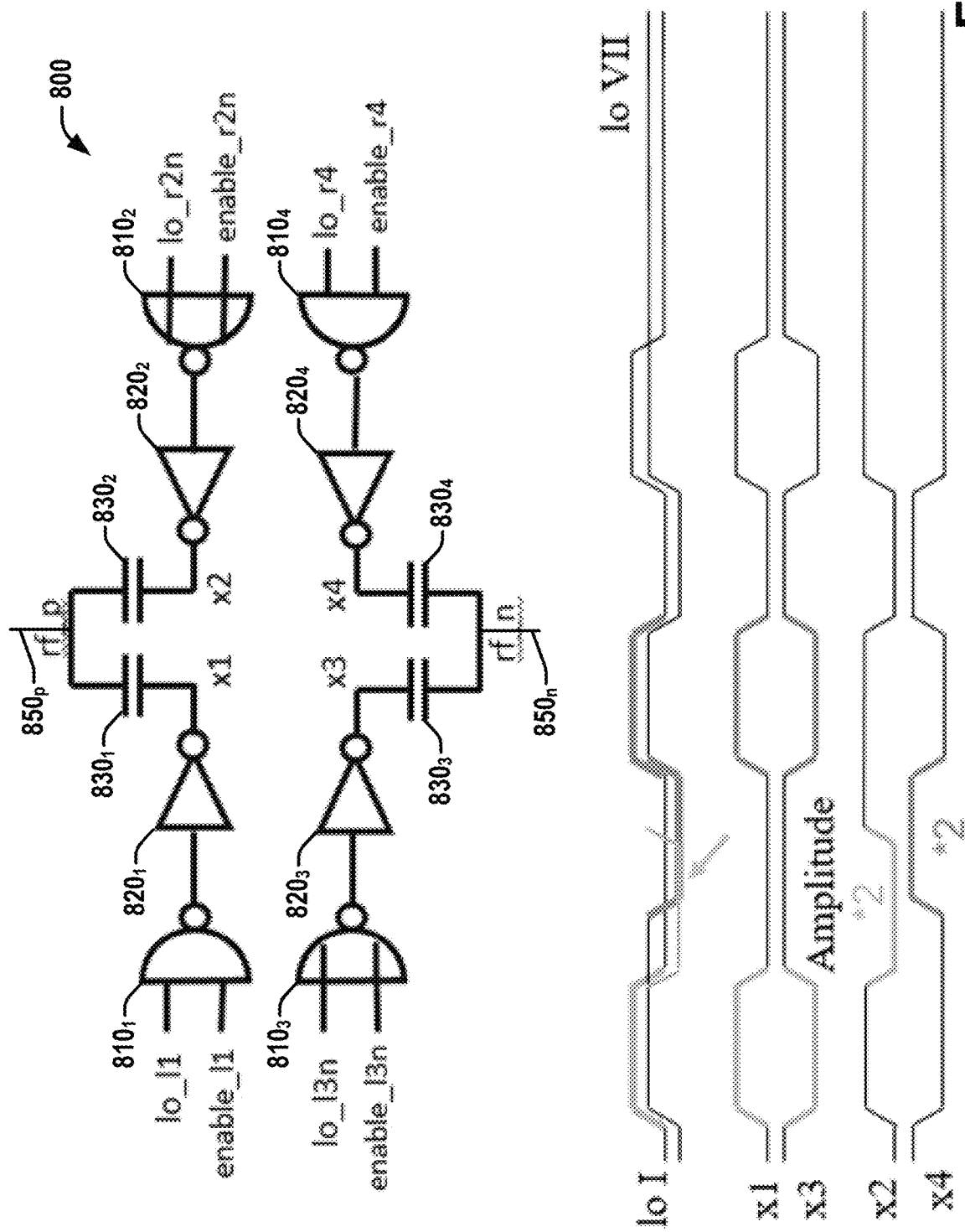
FIG. 8 is a diagram illustrating an embodiment of an example CDAC unit cell and associated example signals, according to various aspects discussed herein.

Referring to FIG. 8, illustrated is a diagram of an embodiment of an example CDAC unit cell 800 and associated example signals, according to various aspects discussed herein. Example CDAC unit cell 800 comprises four capacitors $830_1$-$830_4$, each in series with an associated inverter $820_1$-$820_4$, to generate the analog outputs $850_p$ and $850_n$ (which can be common outputs for a plurality of example CDAC unit cells 800), similarly to the example cell of FIG. 7. However, in example CDAC unit cell 800, each capacitor $830_1$-$830_4$ has its own associated logic gate $810_1$-$810_4$ (NAND, NOR, NOR, and NAND, respectively, in the example embodiment 800) to trigger the pulses based on its own associated clock signal (lo_l1, lo_r2n, lo_l3n, and lo_r4, respectively) and associated enable signal based on the digital data streams (enable_l1, enable_r2n, enable_l3n, and enable_r4, respectively). For a DAC array, each of a plurality of CDAC unit cells 800 (e.g., which can be arranged in a plurality of lines and a plurality of columns) can share inputs (lo_l1, lo_r2n, lo_l3n, lo_r4, enable_l1, enable_r2n, enable_l3n, and enable_r4) and outputs rf_p $850_p$ and rf_n $850_n$.

Figure 9:
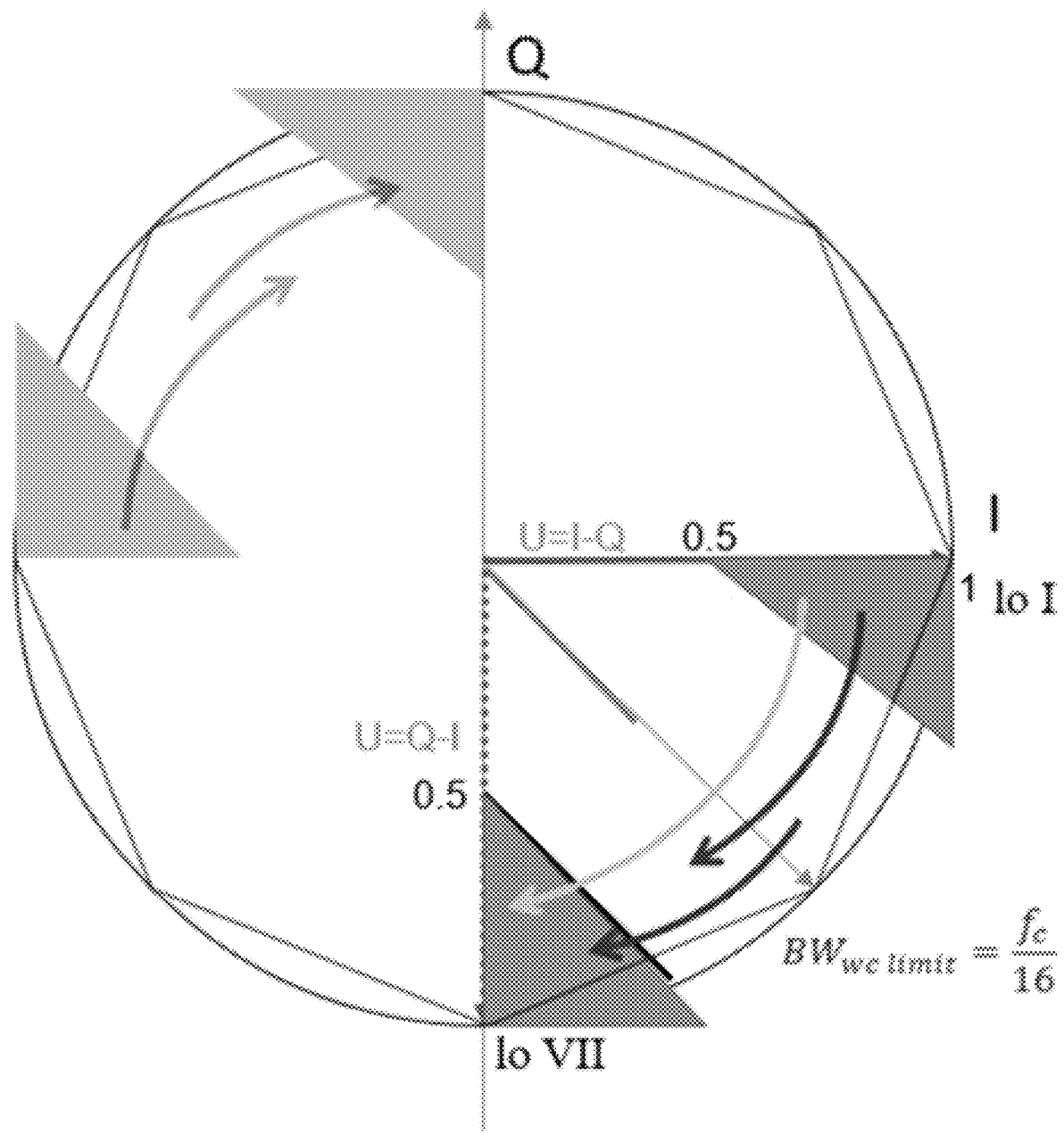
FIG. 9 is a diagram illustrating possible octant transitions of the CDAC unit cell of FIG. 8, in connection with various aspects discussed herein.

However, the approach of example CDAC unit cell 800 limits the possible amplitude for the transition. Referring to FIG. 9, illustrated is a diagram showing possible octant transitions of the CDAC unit cell 800 of FIG. 8, in connection with various aspects discussed herein. The shaded triangles in FIG. 9 are forbidden zones for jumping from one octant to the other (because the amplitude is doubled), which results in a bandwidth limit of approximately LO frequency divided by 16 for the baseband signal. Simulations for existing standards based on embodiments such as example CDAC unit cell 800 demonstrate that this is not a real limitation. Even for signals which are strongly nonlinear and limited by peak to average reduction, this limitation reduces the EVM (Error Vector Magnitude) by less than 0.1%.

Techniques employed by various embodiments can generate some asymmetry in the differential circuit. In most scenarios, this is negligible, because the amplitude at this octant change is small. To further reduce this asymmetry, some embodiments can comprise a DAC array built to mitigate it, for example, such that every even column is configured to generate the first pulse and every odd column is configured to generate the second pulse (or vice versa).

Figure 10:
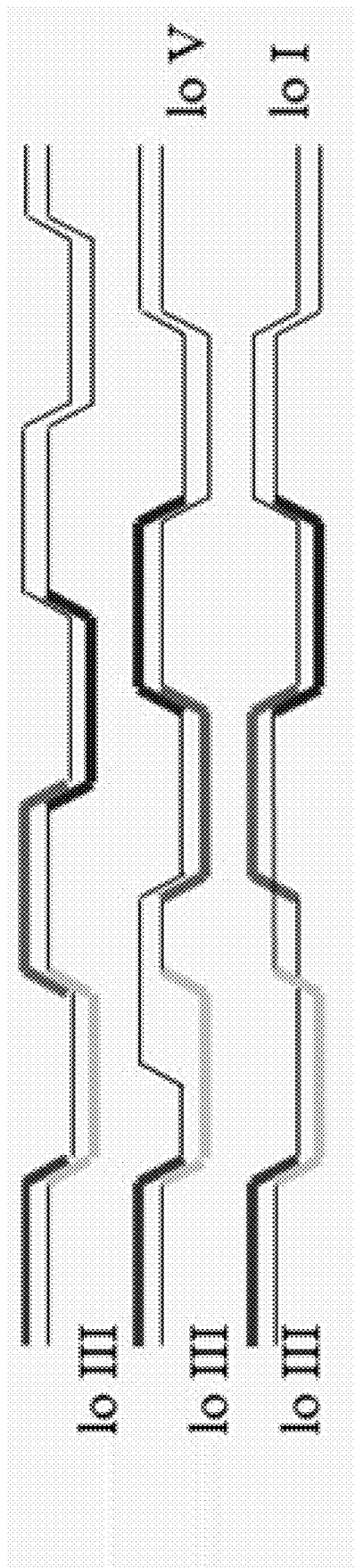
FIG. 10 is a timing diagram illustrating example transitions from LO III to LO V and LO III to LO I by a unit cell according to aspects discussed herein.
Figure 10:
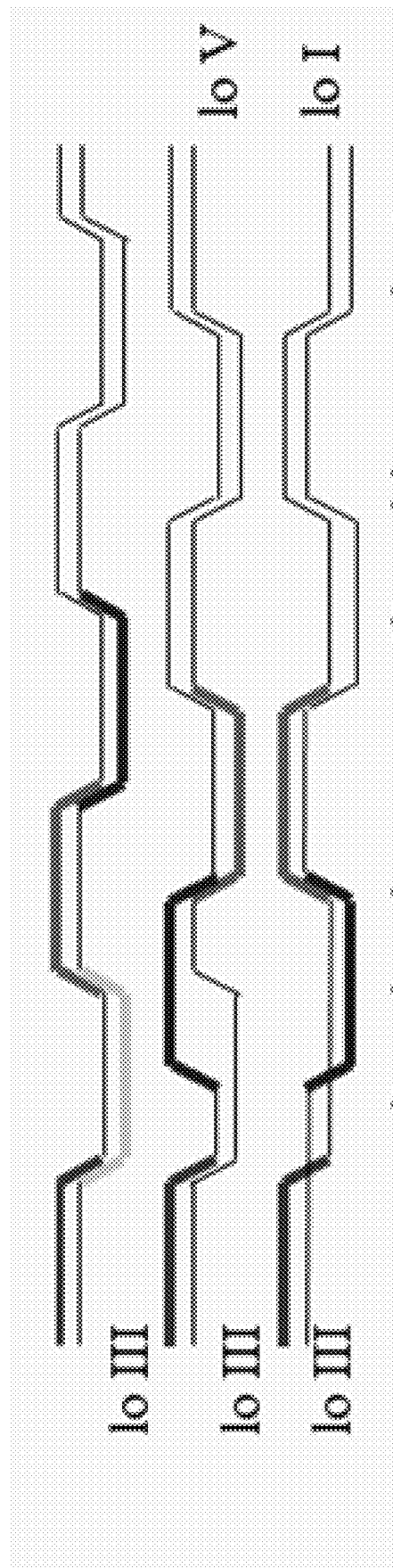

Additionally, CDAC unit cell embodiments discussed herein (and DACs employing such unit cells) are capable of generating positive and negative pulses independently. Referring to FIG. 10, illustrated is an example timing diagram of transitions from LO III to LO V and LO III to LO I by a unit cell according to aspects discussed herein. The independent generation of positive and negative pulses effectively provides a kind of oversampling that can improve the performance of the DAC.

Figure 11:
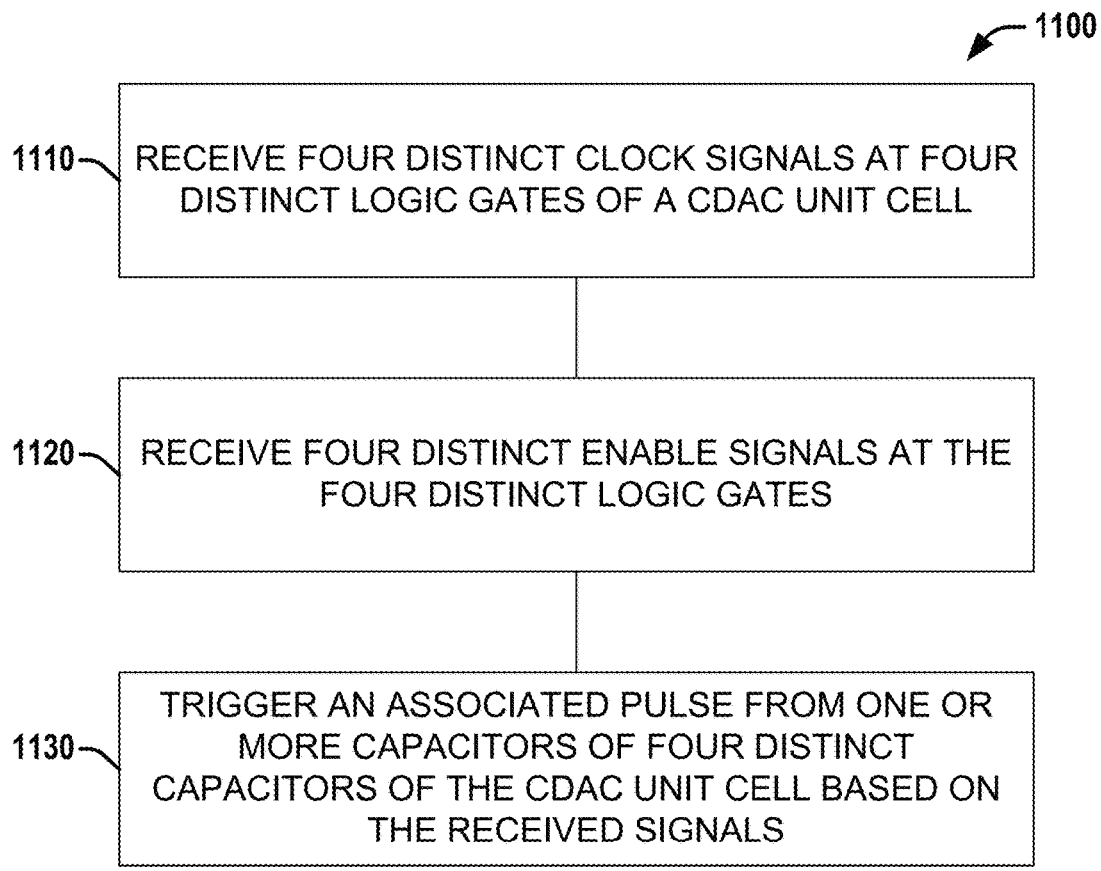
FIG. 11 illustrates a flow diagram of an example method of employing a CDAC unit cell according to various aspects described herein.

Referring to FIG. 11, illustrated is a flow diagram of an example method 1100 of employing a CDAC unit cell according to various aspects described herein. In some aspects, method 1100 can be performed at a CDAC unit cell, DAC array comprising the CDAC unit cell, or a transmitter (e.g., of a mobile device such as a UE or an access point such as an eNB or a gNB, etc.) comprising a DAC comprising the CDAC unit cell. In other aspects, a machine readable medium can store instructions associated with method 1100 that, when executed, can cause a transmitter to perform the acts of method 1100.

At 1110, four distinct clock signals can be received at four distinct logic gates of a CDAC unit cell according to various embodiments discussed herein.

At 1120, four distinct enable signals can be received at the four distinct logic gates of the CDAC unit cell.

At 1130, based on values of the four distinct clock signals and the four distinct enable signals, one or more of the four distinct logic gates can trigger a pulse from an associated capacitor of four distinct capacitors of the CDAC unit cell.

Additionally or alternatively, method 1100 can include one or more other acts described herein in connection with various aspects discussed herein.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is a CDAC (Capacitive DAC (Digital-to-Analog Converter)) unit cell, comprising: a first capacitor configured to generate a first pulse to a first differential output of the CDAC unit cell in response to a first trigger signal, wherein the first trigger signal is generated based on a first enable signal and a first clock signal; a second capacitor configured to generate a second pulse to the first differential output of the CDAC unit cell in response to a second trigger signal, wherein the second trigger signal is generated based on a second enable signal and a second clock signal, wherein the first differential output is different from the second differential output; a third capacitor configured to generate a third pulse to a second differential output of the CDAC unit cell in response to a third trigger signal, wherein the third trigger signal is generated based on a third enable signal and a third clock signal; and a fourth capacitor configured to generate a fourth pulse to the second differential output of the CDAC unit cell in response to a fourth trigger signal, wherein the fourth trigger signal is generated based on a fourth enable signal and a fourth clock signal, wherein each of the first enable signal, the second enable signal, the third enable signal, and the fourth enable signal is different, and wherein each of the first clock signal, the second clock signal, the third clock signal, and the fourth clock signal is different.

Example 2 comprises the subject matter of any variation of any of example(s) 1, further comprising: a first logic gate configured to receive the first enable signal and the first clock signal, and to generate the first trigger signal based on the first enable signal and the first clock signal; a second logic gate configured to receive the second enable signal and the second clock signal, and to generate the second trigger signal based on the second enable signal and the second clock signal; a third logic gate configured to receive the third enable signal and the third clock signal, and to generate the third trigger signal based on the third enable signal and the third clock signal; and a fourth logic gate configured to receive the fourth enable signal and the fourth clock signal, and to generate the fourth trigger signal based on the fourth enable signal and the fourth clock signal.

Example 3 comprises the subject matter of any variation of any of example(s) 2, wherein the first logic gate and the fourth logic gate are a first type of logic gate, and the second logic gate and the third logic gate are a different second type of logic gate.

Example 4 comprises the subject matter of any variation of any of example(s) 1-3, further comprising: a first inverter, wherein the first capacitor is configured to receive the first trigger signal via the first inverter; a second inverter, wherein the second capacitor is configured to receive the second trigger signal via the second inverter; a third inverter, wherein the third capacitor is configured to receive the third trigger signal via the third inverter; and a fourth inverter, wherein the fourth capacitor is configured to receive the fourth trigger signal via the fourth inverter.

Example 5 comprises the subject matter of any variation of any of example(s) 1-4, wherein each of the first pulse, the second pulse, the third pulse, and the fourth pulse is generated as a single ended pulse with an amplitude twice that of a corresponding double ended pulse.

Example 6 is a RFDAC (Radio Frequency DAC (Digital-to-Analog Converter)) comprising: a DAC array comprising a plurality of CDAC (Capacitive DAC) unit cells arranged in a plurality of lines and a plurality of columns, wherein each CDAC unit cell of the plurality of CDAC unit cells comprises: a first capacitor of that CDAC unit cell configured to generate a first pulse to a first differential output of that CDAC unit cell in response to a first trigger signal of that CDAC unit cell, wherein the first trigger signal of that CDAC unit cell is generated based on a first enable signal of that CDAC unit cell and a first clock signal of that CDAC unit cell; a second capacitor of that CDAC unit cell configured to generate a second pulse to the first differential output of that CDAC unit cell in response to a second trigger signal of that CDAC unit cell, wherein the second trigger signal of that CDAC unit cell is generated based on a second enable signal of that CDAC unit cell and a second clock signal of that CDAC unit cell; a third capacitor of that CDAC unit cell configured to generate a third pulse to a second differential output of that CDAC unit cell in response to a third trigger signal of that CDAC unit cell, wherein the third trigger signal of that CDAC unit cell is generated based on a third enable signal of that CDAC unit cell and a third clock signal of that CDAC unit cell, wherein the first differential output is different from the second differential output; and a fourth capacitor of that CDAC unit cell configured to generate a fourth pulse to the second differential output of that CDAC unit cell in response to a fourth trigger signal of that CDAC unit cell, wherein the fourth trigger signal of that CDAC unit cell is generated based on a fourth enable signal of that CDAC unit cell and a fourth clock signal of that CDAC unit cell, wherein each of the first enable signal of that CDAC unit cell, the second enable signal of that CDAC unit cell, the third enable signal of that CDAC unit cell, and the fourth enable signal of that CDAC unit cell is different, and wherein each of the first clock signal of that CDAC unit cell, the second clock signal of that CDAC unit cell, the third clock signal of that CDAC unit cell, and the fourth clock signal of that CDAC unit cell is different.

Example 7 comprises the subject matter of any variation of any of example(s) 6, wherein the plurality of columns comprises a plurality of even columns comprising a first set of CDAC unit cells of the plurality of CDAC unit cells and the plurality of columns comprises a plurality of odd columns comprising a second set of CDAC unit cells of the plurality of CDAC unit cells, and wherein, for at least one phase transition from a first phase to a second phase, the first set of CDAC unit cells is configured to generate an associated pulse for the first phase and the second set of CDAC unit cells is configured to generate an associated pulse for the second phase.

Example 8 comprises the subject matter of any variation of any of example(s) 6-7, wherein each CDAC unit cell of the plurality of CDAC unit cells comprises: a first logic gate of that CDAC unit cell configured to receive the first enable signal of that CDAC unit cell and the first clock signal of that CDAC unit cell, and to generate the first trigger signal of that CDAC unit cell based on the first enable signal of that CDAC unit cell and the first clock signal of that CDAC unit cell; a second logic gate of that CDAC unit cell configured to receive the second enable signal of that CDAC unit cell and the second clock signal of that CDAC unit cell, and to generate the second trigger of that CDAC unit cell signal based on the second enable signal of that CDAC unit cell and the second clock signal of that CDAC unit cell; a third logic gate of that CDAC unit cell configured to receive the third enable signal of that CDAC unit cell and the third clock signal of that CDAC unit cell, and to generate the third trigger signal of that CDAC unit cell based on the third enable signal of that CDAC unit cell and the third clock signal of that CDAC unit cell; and a fourth logic gate of that CDAC unit cell configured to receive the fourth enable signal of that CDAC unit cell and the fourth clock signal of that CDAC unit cell, and to generate the fourth trigger signal of that CDAC unit cell based on the fourth enable signal of that CDAC unit cell and the fourth clock signal of that CDAC unit cell.

Example 9 comprises the subject matter of any variation of any of example(s) 8, wherein, for each CDAC unit cell, the first logic gate of that CDAC unit cell and the fourth logic gate of that CDAC unit cell are a first type of logic gate, and the second logic gate of that CDAC unit cell and the third logic gate of that CDAC unit cell are a second type of logic gate, wherein the first type of logic gate is different than the second type of logic gate.

Example 10 comprises the subject matter of any variation of any of example(s) 6-9, wherein each CDAC unit cell of the plurality of CDAC unit cells further comprises: a first inverter of that CDAC unit cell, wherein the first capacitor of that CDAC unit cell is configured to receive the first trigger signal of that CDAC unit cell via the first inverter of that CDAC unit cell; a second inverter of that CDAC unit cell, wherein the second capacitor of that CDAC unit cell is configured to receive the second trigger signal of that CDAC unit cell via the second inverter of that CDAC unit cell; a third inverter of that CDAC unit cell, wherein the third capacitor of that CDAC unit cell is configured to receive the third trigger signal of that CDAC unit cell via the third inverter of that CDAC unit cell; and a fourth inverter of that CDAC unit cell, wherein the fourth capacitor of that CDAC unit cell is configured to receive the fourth trigger signal of that CDAC unit cell via the fourth inverter of that CDAC unit cell.

Example 11 comprises the subject matter of any variation of any of example(s) 6-10, wherein, for each CDAC unit cell of the plurality of CDAC unit cells each of the first pulse of that CDAC unit cell, the second pulse of that CDAC unit cell, the third pulse of that CDAC unit cell, and the fourth pulse of that CDAC unit cell is generated as a single ended pulse with an amplitude twice that of a corresponding double ended pulse.

Example 12 comprises the subject matter of any variation of any of example(s) 6-11, wherein the RFDAC is a multi-phase DAC with at least eight distinct phases.

Example 13 is a transceiver comprising the subject matter of any variation of any of example(s) 6-12.

Example 14 is a CDAC (Capacitive DAC (Digital-to-Analog Converter)) unit cell, comprising: four capacitors, wherein a first pair of capacitors of the four capacitors is connected to a first differential output of the CDAC unit cell and a different second pair of capacitors of the four capacitors is connected to a different second differential output of the CDAC unit cell; and four logic gates, wherein each logic gate of the four logic gates is configured to receive an associated clock signal of four different clock signals and an associated enable signal of four different enable signals, and wherein each logic gate of the four logic gates is configured to trigger an associated pulse from an associated capacitor of the four capacitors based on the associated clock signal and the associated enable signal of that logic gate.

Example 15 comprises the subject matter of any variation of any of example(s) 14, wherein a first pair of logic gates of the four logic gates is a first type of logic gate, wherein a second pair of logic gates of the four logic gates is a second type of logic gate, and wherein the first type of logic gate is different than the second type of logic gate.

Example 16 comprises the subject matter of any variation of any of example(s) 14-15, further comprising four inverters, wherein each inverter of the four inverters is configured to invert an associated output of an associated logic gate of the four logic gates to generate an associated trigger signal to an associated capacitor of the four capacitors.

Example 17 comprises the subject matter of any variation of any of example(s) 14-16, wherein, for each capacitor of the four capacitors, that capacitor is configured to generate the associated pulse from that capacitor as a single ended pulse with an amplitude twice that of a corresponding double ended pulse.

Example 18 is a RFDAC (Radio Frequency DAC (Digital-to-Analog Converter)) comprising: a DAC array comprising a plurality of CDAC (Capacitive DAC) unit cells arranged in a plurality of lines and a plurality of columns, wherein each CDAC unit cell of the plurality of CDAC unit cells comprises: four capacitors of that CDAC unit cell, wherein a first pair of capacitors of the four capacitors of that CDAC unit cell is connected to a first differential output of that CDAC unit cell and a different second pair of capacitors of the four capacitors of that CDAC unit cell is connected to a different second differential output of that CDAC unit cell; and four logic gates of that CDAC unit cell, wherein each logic gate of the four logic gates of that CDAC unit cell is configured to receive an associated clock signal of four different clock signals of that CDAC unit cell and an associated enable signal of four different enable signals of that CDAC unit cell, and wherein each logic gate of the four logic gates of that CDAC unit cell is configured to trigger a pulse from an associated capacitor of the four capacitors of that CDAC unit cell based on the associated clock signal and the associated enable signal of that logic gate of that CDAC unit cell.

Example 19 comprises the subject matter of any variation of any of example(s) 18, wherein the plurality of columns comprises a plurality of even columns comprising a first set of CDAC unit cells of the plurality of CDAC unit cells and the plurality of columns comprises a plurality of odd columns comprising a second set of CDAC unit cells of the plurality of CDAC unit cells, and wherein, for at least one phase transition from a first phase to a second phase, the first set of CDAC unit cells is configured to generate an associated pulse for the first phase and the second set of CDAC unit cells is configured to generate an associated pulse for the second phase.

Example 20 comprises the subject matter of any variation of any of example(s) 18-19, wherein, for each CDAC unit cell, each logic gate of the four logic gates of that CDAC unit cell is the same type of logic gate.

Example 21 comprises the subject matter of any variation of any of example(s) 18-20, wherein each CDAC unit cell of the plurality of CDAC unit cells further comprises four inverters of that CDAC unit cell, wherein each inverter of the four inverters of that CDAC unit cell is configured to invert an associated output of an associated logic gate of the four logic gates of that CDAC unit cell to generate an associated trigger signal to an associated capacitor of the four capacitors of that CDAC unit cell.

Example 22 comprises the subject matter of any variation of any of example(s) 18-22, wherein, for each CDAC unit cell of the plurality of CDAC unit cells, for each capacitor of the four capacitors of that CDAC unit cell, that capacitor is configured to generate the associated pulse from that capacitor as a single ended pulse with an amplitude twice that of a corresponding double ended pulse.

Example 23 comprises an apparatus comprising means for executing any of the described operations of examples 1-22.

Example 24 comprises a method of performing any of the described operations of examples 1-22.

Example 25 comprises a machine readable medium that stores instructions for execution by a processor to perform any of the described operations of examples 1-22.

Example 26 comprises an apparatus comprising circuitry configured to perform any of the described operations of examples 1-22.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A CDAC (Capacitive DAC (Digital-to-Analog Converter)) unit cell, comprising:
    a first capacitor configured to generate a first pulse to a first differential output of the CDAC unit cell in response to a first trigger signal, wherein the first trigger signal is generated based on a first enable signal and a first clock signal;
    a second capacitor configured to generate a second pulse to the first differential output of the CDAC unit cell in response to a second trigger signal, wherein the second trigger signal is generated based on a second enable signal and a second clock signal;
    a third capacitor configured to generate a third pulse to a second differential output of the CDAC unit cell in response to a third trigger signal, wherein the third trigger signal is generated based on a third enable signal and a third clock signal, and wherein the first differential output is different from the second differential output;
    a fourth capacitor configured to generate a fourth pulse to the second differential output of the CDAC unit cell in response to a fourth trigger signal, wherein the fourth trigger signal is generated based on a fourth enable signal and a fourth clock signal;
    a first logic gate configured to receive the first enable signal and the first clock signal, and to generate the first trigger signal based on the first enable signal and the first clock signal;
    a second logic gate configured to receive the second enable signal and the second clock signal, and to generate the second trigger signal based on the second enable signal and the second clock signal;
    a third logic gate configured to receive the third enable signal and the third clock signal, and to generate the third trigger signal based on the third enable signal and the third clock signal; and
    a fourth logic gate configured to receive the fourth enable signal and the fourth clock signal, and to generate the fourth trigger signal based on the fourth enable signal and the fourth clock signal, and
    wherein each of the first enable signal, the second enable signal, the third enable signal, and the fourth enable signal is different, and wherein each of the first clock signal, the second clock signal, the third clock signal, and the fourth clock signal is different.

2. The CDAC unit cell of claim 1, wherein the first logic gate and the fourth logic gate are a first type of logic gate, and the second logic gate and the third logic gate are a second type of logic gate, wherein the first type of logic gate is different than the second type of logic gate.

3. The CDAC unit cell of claim 1, further comprising:
    a first inverter, wherein the first capacitor is configured to receive the first trigger signal via the first inverter;
    a second inverter, wherein the second capacitor is configured to receive the second trigger signal via the second inverter;
    a third inverter, wherein the third capacitor is configured to receive the third trigger signal via the third inverter; and
    a fourth inverter, wherein the fourth capacitor is configured to receive the fourth trigger signal via the fourth inverter.

4. A RFDAC (Radio Frequency DAC (Digital-to-Analog Converter)) comprising:
    a DAC array comprising a plurality of CDAC (Capacitive DAC) unit cells arranged in a plurality of lines and a plurality of columns, wherein each CDAC unit cell of the plurality of CDAC unit cells comprises:
        a first capacitor of that CDAC unit cell configured to generate a first pulse to a first differential output of that CDAC unit cell in response to a first trigger signal of that CDAC unit cell, wherein the first trigger signal of that CDAC unit cell is generated based on a first enable signal of that CDAC unit cell and a first clock signal of that CDAC unit cell;
        a second capacitor of that CDAC unit cell configured to generate a second pulse to the first differential output of that CDAC unit cell in response to a second trigger signal of that CDAC unit cell, wherein the second trigger signal of that CDAC unit cell is generated based on a second enable signal of that CDAC unit cell and a second clock signal of that CDAC unit cell;

a third capacitor of that CDAC unit cell configured to generate a third pulse to a second differential output of that CDAC unit cell in response to a third trigger signal of that CDAC unit cell, wherein the third trigger signal of that CDAC unit cell is generated based on a third enable signal of that CDAC unit cell and a third clock signal of that CDAC unit cell, wherein the first differential output is different from the second differential output; and a fourth capacitor of that CDAC unit cell configured to generate a fourth pulse to the second differential output of that CDAC unit cell in response to a fourth trigger signal of that CDAC unit cell, wherein the fourth trigger signal of that CDAC unit cell is generated based on a fourth enable signal of that CDAC unit cell and a fourth clock signal of that CDAC unit cell, wherein each of the first enable signal of that CDAC unit cell, the second enable signal of that CDAC unit cell, the third enable signal of that CDAC unit cell, and the fourth enable signal of that CDAC unit cell is different, and wherein each of the first clock signal of that CDAC unit cell, the second clock signal of that CDAC unit cell, the third clock signal of that CDAC unit cell, and the fourth clock signal of that CDAC unit cell is different, wherein the plurality of columns comprises a plurality of even columns comprising a first set of CDAC unit cells of the plurality of CDAC unit cells and the plurality of columns comprises a plurality of odd columns comprising a second set of CDAC unit cells of the plurality of CDAC unit cells, and wherein, for at least one phase transition from a first phase to a second phase, the first set of CDAC unit cells is configured to generate an associated pulse for the first phase and the second set of CDAC unit cells is configured to generate an associated pulse for the second phase.

5. The RFDAC of claim 4, wherein each CDAC unit cell of the plurality of CDAC unit cells comprises:

a first logic gate of that CDAC unit cell configured to receive the first enable signal of that CDAC unit cell and the first clock signal of that CDAC unit cell, and to generate the first trigger signal of that CDAC unit cell based on the first enable signal of that CDAC unit cell and the first clock signal of that CDAC unit cell;

a second logic gate of that CDAC unit cell configured to receive the second enable signal of that CDAC unit cell and the second clock signal of that CDAC unit cell, and to generate the second trigger of that CDAC unit cell signal based on the second enable signal of that CDAC unit cell and the second clock signal of that CDAC unit cell;

a third logic gate of that CDAC unit cell configured to receive the third enable signal of that CDAC unit cell and the third clock signal of that CDAC unit cell, and to generate the third trigger signal of that CDAC unit cell based on the third enable signal of that CDAC unit cell and the third clock signal of that CDAC unit cell; and a fourth logic gate of that CDAC unit cell configured to receive the fourth enable signal of that CDAC unit cell and the fourth clock signal of that CDAC unit cell, and to generate the fourth trigger signal of that CDAC unit cell based on the fourth enable signal of that CDAC unit cell and the fourth clock signal of that CDAC unit cell.

6. The RFDAC of claim 5, wherein, for each CDAC unit cell, the first logic gate of that CDAC unit cell and the fourth logic gate of that CDAC unit cell are a first type of logic gate, and the second logic gate of that CDAC unit cell and the third logic gate of that CDAC unit cell are a second type of logic gate, wherein the first type of logic gate is different than the second type of logic gate.

7. The RFDAC of claim 4, wherein each CDAC unit cell of the plurality of CDAC unit cells further comprises:

a first inverter of that CDAC unit cell, wherein the first capacitor of that CDAC unit cell is configured to receive the first trigger signal of that CDAC unit cell via the first inverter of that CDAC unit cell;

a second inverter of that CDAC unit cell, wherein the second capacitor of that CDAC unit cell is configured to receive the second trigger signal of that CDAC unit cell via the second inverter of that CDAC unit cell;

a third inverter of that CDAC unit cell, wherein the third capacitor of that CDAC unit cell is configured to receive the third trigger signal of that CDAC unit cell via the third inverter of that CDAC unit cell; and a fourth inverter of that CDAC unit cell, wherein the fourth capacitor of that CDAC unit cell is configured to receive the fourth trigger signal of that CDAC unit cell via the fourth inverter of that CDAC unit cell.

8. The RFDAC of claim 4, wherein the RFDAC is a multiphase DAC with at least eight distinct phases.

9. A transceiver comprising the RFDAC of claim 4.

10. A CDAC (Capacitive DAC (Digital-to-Analog Converter)) unit cell, comprising:

four capacitors, wherein a first pair of capacitors of the four capacitors is connected to a first differential output of the CDAC unit cell and a different second pair of capacitors of the four capacitors is connected to a different second differential output of the CDAC unit cell; and four logic gates, wherein each logic gate of the four logic gates is configured to receive an associated clock signal of four different clock signals and an associated enable signal of four different enable signals, and wherein each logic gate of the four logic gates is configured to trigger an associated pulse from an associated capacitor of the four capacitors based on the associated clock signal and the associated enable signal of that logic gate, wherein a first pair of logic gates of the four logic gates is a first type of logic gate, wherein a second pair of logic gates of the four logic gates is a second type of logic gate, and wherein the first type of logic gate is different than the second type of logic gate.

11. The CDAC unit cell of claim 10, further comprising four inverters, wherein each inverter of the four inverters is configured to invert an associated output of an associated logic gate of the four logic gates to generate an associated trigger signal to an associated capacitor of the four capacitors.

12. A RFDAC (Radio Frequency DAC (Digital-to-Analog Converter)) comprising:

a DAC array comprising a plurality of CDAC (Capacitive DAC) unit cells arranged in a plurality of lines and a plurality of columns, wherein each CDAC unit cell of the plurality of CDAC unit cells comprises:

four capacitors of that CDAC unit cell, wherein a first pair of capacitors of the four capacitors of that CDAC unit cell is connected to a first differential output of that CDAC unit cell and a different second pair of capacitors of the four capacitors of that CDAC unit cell is connected to a different second differential output of that CDAC unit cell; and four logic gates of that CDAC unit cell, wherein each logic gate of the four logic gates of that CDAC unit cell is configured to receive an associated clock signal of four different clock signals of that CDAC unit cell and an associated enable signal of four different enable signals of that CDAC unit cell, and wherein each logic gate of the four logic gates of that CDAC unit cell is configured to trigger a pulse from an associated capacitor of the four capacitors of that CDAC unit cell based on the associated clock signal and the associated enable signal of that logic gate of that CDAC unit cell, wherein the plurality of columns comprises a plurality of even columns comprising a first set of CDAC unit cells of the plurality of CDAC unit cells and the plurality of columns comprises a plurality of odd columns comprising a second set of CDAC unit cells of the plurality of CDAC unit cells, and wherein, for at least one phase transition from a first phase to a second phase, the first set of CDAC unit cells is configured to generate an associated pulse for the first phase and the second set of CDAC unit cells is configured to generate an associated pulse for the second phase.

13. The RFDAC of claim 12, wherein, for each CDAC unit cell, each logic gate of the four logic gates of that CDAC unit cell is the same type of logic gate.

14. The RFDAC of claim 12, wherein each CDAC unit cell of the plurality of CDAC unit cells further comprises four inverters of that CDAC unit cell, wherein each inverter of the four inverters of that CDAC unit cell is configured to invert an associated output of an associated logic gate of the four logic gates of that CDAC unit cell to generate an associated trigger signal to an associated capacitor of the four capacitors of that CDAC unit cell.

* * * * *